(12) United States Patent
Swift et al.

(10) Patent No.: US 6,791,883 B2
(45) Date of Patent: Sep. 14, 2004

(54) PROGRAM AND ERASE IN A THIN FILM STORAGE NON-VOLATILE MEMORY

(75) Inventors: Craig T. Swift, Austin, TX (US); Jane A. Yater, Austin, TX (US); Alexander B. Hoefler, Austin, TX (US); Ko-Min Chang, Austin, TX (US); Erwin J. Prinz, Austin, TX (US); Bruce L. Morton, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 10/178,658

(22) Filed: Jun. 24, 2002

(65) Prior Publication Data

US 2003/0235083 A1 Dec. 25, 2003

(51) Int. Cl.$^7$ ............................................. G11C 16/00
(52) U.S. Cl. ............................ 365/185.29; 365/185.18; 365/185.28
(58) Field of Search ..................... 365/185.18, 185.28, 365/185.29

(56) References Cited

U.S. PATENT DOCUMENTS

| | | | |
|---|---|---|---|
| 5,659,504 A | 8/1997 | Bude et al. | 365/185.27 |
| 5,789,776 A | 8/1998 | Lancaster et al. | 257/296 |
| 5,838,617 A | 11/1998 | Bude et al. | 365/185.18 |
| 6,009,011 A | * 12/1999 | Yamauchi | 365/185.28 |
| 6,011,722 A | 1/2000 | Bude et al. | 365/185.29 |
| 6,011,725 A | 1/2000 | Eitan | 365/185.33 |
| 6,307,775 B1 | * 10/2001 | Forbes et al. | 365/185.25 |
| 6,356,482 B1 | * 3/2002 | Derhacobian et al. | 365/185.29 |
| 6,452,840 B1 | * 9/2002 | Sunkavalli et al. | 365/185.29 |
| 6,721,204 B1 | * 4/2004 | Yeh et al. | 365/185.24 |
| 6,724,661 B2 | * 4/2004 | Lee et al. | 365/185.29 |

OTHER PUBLICATIONS

"Technical Comparison of Floating Gate Reprogrammable Nonvolatile Memories," Silicon Storage Technology, Inc., Nov. 2001, pp. 1–8.

Cho et al., "High Performance SONOS Memory Cells Free of Drain Turn–On and Over–Erase: Compatibility Issue with Current Flash Technology," IEEE Electron Device Letters, vol. 21, No. 8, Aug. 2000, pp. 399–401.

* cited by examiner

Primary Examiner—Tan T. Nguyen
(74) Attorney, Agent, or Firm—Kim-Marie Vo; James C. Clingan, Jr.

(57) ABSTRACT

A non-volatile memory having a thin film dielectric storage element is programmed by hot carrier injection (HCI) and erased by tunneling. The typical structure for the memory cells for this type of memory is silicon, oxide, nitride, oxide, and silicon (SONOS). The hot carrier injection provides relatively fast programming for SONOS, while the tunneling provides for erase that avoids the difficulties with the hot hole erase (HHE) type erase that generally accompanies hot carrier injection for programming. HHE is significantly more damaging to dielectrics leading to reliability issues. HHE also has a relatively narrow area of erasure that may not perfectly match the pattern for the HCI programming leaving an incomplete erasure. The tunnel erase effectively covers the entire area so there is no concern about incomplete erase. Although tunnel erase is slower than HHE, erase time is generally less critical in a system operation than is programming time.

38 Claims, 2 Drawing Sheets

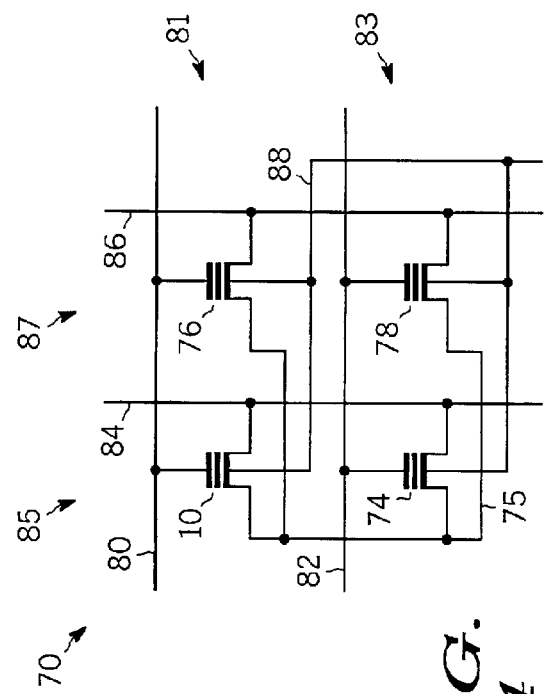

PROGRAM AND ERASE IN A THIN FILM STORAGE NON-VOLATILE MEMORY

RELATED APPLICATION

This application is related to U.S. patent application Ser. No. 09/639,195 filed Aug. 15, 2000, entitled "Non-Volatile Memory, Method of Manufacture and Method of Programming" and is assigned to the current assignee hereof. This application is also related to U.S. patent application Ser. No. 10/025,292 filed Dec. 19, 2001, entitled "Non-Volatile Memory and Method of Forming Thereof" and is assigned to the current assignee hereof.

FIELD OF THE INVENTION

This invention relates generally to semiconductor devices, and more specifically, to non-volatile memory (NVM) devices.

BACKGROUND

Non-volatile memory (NVM) devices are desirable memories because they retain their charge even when disconnected from a power source. Computers and cellular telephones, for example, use NVM devices to preserve information when turned off. One type of NVM cell is a SONOS (silicon-oxide-nitride-oxide-silicon) device, which has a silicon, (top) oxide, nitride, and (bottom) oxide stack listed from top to bottom, formed over a semiconductor, such as silicon, substrate.

One method to program and erase a SONOS device is to use tunneling. Typically, the bottom oxide of SONOS is used to prevent electron movement between the substrate and the nitride. However, the bottom oxide is designed to be thin enough (e.g., approximately 18 to 30 Angstroms in thickness) so that electrons can be transported by tunneling through the bottom oxide when an electric field is generated when biasing the SONOS device. In order to quickly programming of the SONOS device, as required in many NVM applications, the bottom oxide should be less than or equal to approximately 22 Angstroms. However, in this thickness range the electrons can easily travel (leak) from the nitride layer into the substrate and therefore, the SONOS device can easily lose data. In addition, read disturb problems can arise.

If a thicker bottom oxide (e.g., approximately 50–100 Angstroms in thickness) is used, hot carrier injection (HCI) and hot hole erase (HHE) can be performed. An inversion layer is created in a channel region of the SONOS device, which transmits electrons from a source region to a drain region. Electrons are injected into the nitride through the bottom oxide. Holes, which are created in a drain depletion region of the device, are injected into the nitride to erase the SONOS device by HHE. Although this program and erase scheme is desirable because it is a fast process (e.g., on the order or microseconds), the location of injected electrons during programming and injected holes during erasing may differ, making it difficult to fully erase the SONOS device. HHE also damages the substrate to tunnel oxide interface and any overlying dielectrics. This damage can lead to reliability concerns n the SONOS device. Therefore, a need exists for a programming and erasing scheme that does not have the negative advantages of the above processes.

BRIEF DESCRIPTION OF THE DRAWINGS

The present invention is illustrated by way of example and is not limited by the accompanying figures, in which like references indicate similar elements.

FIGS. 3–6 illustrate possible arrays in which the NVM device of FIGS. 1 and 2 can be implemented.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Thin-film storage non-volatile memory devices, such as SONOS, offer advantages over floating gate non-volatile memory devices in that the thin film storage non-volatile memory devices have a simpler device structure and manufacturing process, both of which lead to higher yield and lower costs. SONOS devices, in particular, are also immune to the problems of extrinsic charge loss that is observed in floating gate non-volatile memories.

Methods for programming a SONOS device by hot carrier injection (HCI) programming and erasing the SONOS device by tunneling are described herein. Such a program and erase scheme in conjunction with the SONOS device structure enables fast programming without charge leakage through the tunnel dielectric, which in one embodiment is between a substrate and a charge storage layer (e.g., nitride). As a result, the tunnel dielectric serves as a potential barrier that prevents a charge loss of greater than ninety percent per ten years. To enable such a programming and erasing scheme the tunnel dielectric thickness is optimized.

As will be described in more detail below, HCI programming is a localized process, whereas tunnel erasing is a uniform process. Therefore, charges are programmed into the SONOS device in one area (e.g., near the drain region), but the entire charge storage layer is uniformly erased. Using this program and erase scheme provides for fast programming (i.e., on the order of microseconds) and the ability to have a reliable process for erasing the programmed charge in the charge storage layer.

Figure 1:
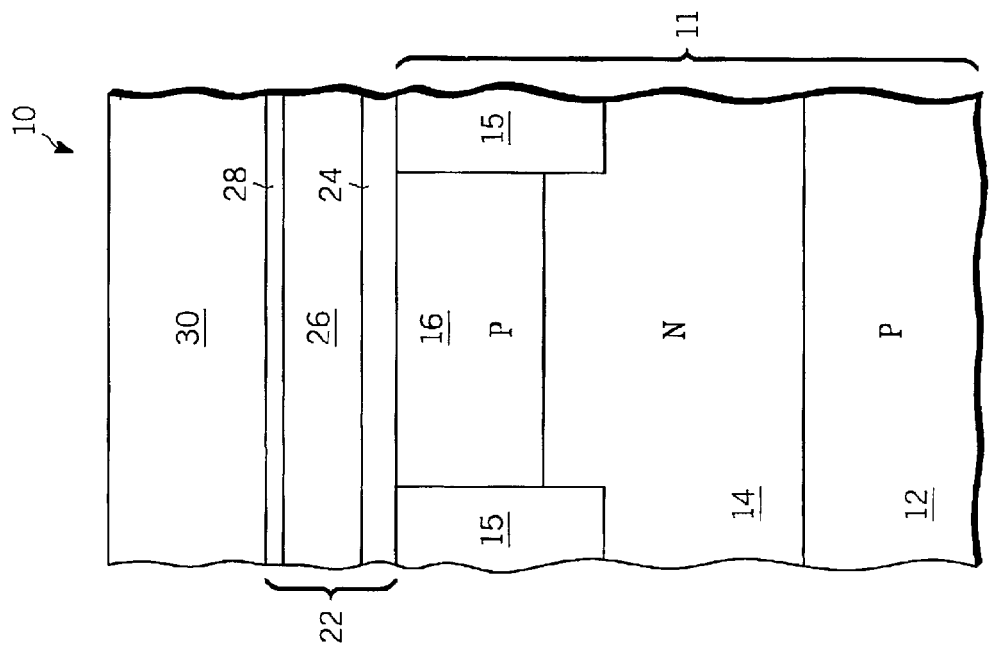
FIG. 1 illustrates a first cross-sectional view along a channel region of a non-volatile memory (NVM) device in accordance with an embodiment of the present invention.

Illustrated in FIG. 1 is a cross-section of a non-volatile memory (NVM) device or cell 10 across a channel region 23 having a gate 30, a tunnel dielectric 24, a charge storage layer (storage dielectric) 26, and a blocking dielectric 28 formed over a semiconductor substrate 11. The semiconductor substrate 11 includes a first p-region 12, an n-region (well) 14, and a second p-region (well) 16. In one embodiment, the semiconductor substrate 11 is purchased from a substrate supplier with the first p-region 12. If not, the first p-region can be formed by ion implanting a p-type species into the semiconductor substrate 11. In one embodiment, the n-region 14 and the second p-region 16 are formed by implanting the semiconductor substrate with an appropriate dopant. For example, if the semiconductor substrate is silicon, boron can be implanted to form a p-region and phosphorus can be implanted to form an n-region. The semiconductor substrate can be any semiconductor material or combinations of materials, such gallium arsenide, silicon germanium, silicon-on-insulator (SOI), the like, and combinations of the above.

The tunnel dielectric 24, the charge storage layer 26, and the blocking dielectric 28 are formed over the semiconductor substrate 11 by chemical vapor deposition (CVD), physical vapor deposition (PVD), atomic layer deposition (ALD), thermal growth, the like, and combinations of the above. The charge storage layer 26 can also be formed by implanting a species (e.g., nitrogen) into a deposited or grown material (e.g., silicon dioxide). In a preferred embodiment, the tunnel dielectric 24, the charge storage layer 26, and the blocking dielectric 28 form an ONO (oxide-nitride-oxide) stack 22 to form a SONOS (silicon-oxide-nitride-oxide-silicon) NVM cell. In one embodiment, the tunnel dielectric 24 is approximately 22 to 32 Angstroms, or more specifically 26–30 Angstroms, of silicon dioxide, the charge storage layer 26 is approximately 50–150 Angstroms of silicon nitride, and the blocking dielectric 28 is approximately 50 to 75 Angstroms of silicon dioxide. The thinner the thickness of the tunnel dielectric 24 (while keeping the other thickness layers of the ONO stack 22 constant), the lower the voltage to be used to erase the NVM device 10, as to be explained in more detail below. In a preferred embodiment, the tunnel dielectric 24 provides a potential barrier that prevents a charge loss of greater than 90% per 10 years. Although the acronym used is SONOS, the materials chosen for each layer do not have to be those in the acronym. Other dielectric materials may be used for the tunnel dielectric 24 and the blocking dielectric 28, and the charge storage layer 26. (Hence, the charge storage layer 26 is a storage dielectric.) The dielectric chosen for the charge storage layer 26 should have a high trap density.

Also, other materials than silicon can be used for the gate 30. The gate 30 is deposited using CVD, PVD, ALD, the like, or combinations of the above over the ONO stack 22. In one embodiment, the gate 30 is approximately 1000 to 1500 Angstroms of polysilicon or a metal-containing material. The gate 30 serves as the word line for the NVM device 10. The gate and the ONO stack overlie a channel region 23.

After forming the layers for the ONO stack 22 and the gate 30, the ONO stack and the gate 30 are etched using a photoresist mask (not shown). The resulting ONO stack 22 and the gate 30 are shown in FIG. 1.

The ONO stack 22 and the gate 30 are used as a mask for forming a source region 18, a drain region 20, which optionally includes a drain halo region 21 in the second p-region 16 by ion implantation. The region between the source region 18 and the drain region 20 is the channel region 23. In the embodiment discussed and illustrated in the figures, the source region 18 and the drain region 20 (except for the drain halo region 21, as will be subsequently explained) are n-type regions and therefore, can be formed by ion implanting phosphorus and/or arsenic at a concentration between approximately 1E20 to 2E21 atoms per centimeter cubed into the substrate 11, if it is silicon. The drain halo region 21 may be implanted after forming the drain region 20 using boron and/or indium to form a more abrupt drain junction (i.e., between the drain halo region 21, which is p-type, and the remainder of the drain region 20, which is n-type.) Thus, when forming the drain halo region 21, this portion of the drain region 20 is converted from one conductivity (e.g., n-type) to another conductivity (e.g., p-type). In one embodiment, boron or indium is implanted at a concentration between the concentration of the second p-type region 16, which may be a boron concentration between 4E17 to 2E18 atoms per centimeter cubed, and 5E18 atoms per centimeter cubed to form the drain halo region 21.

Figure 2:
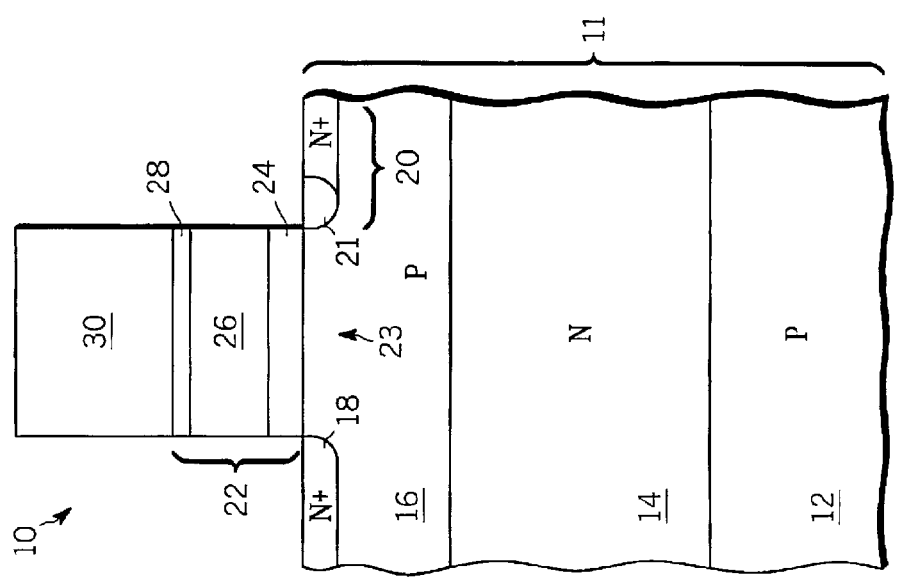
FIG. 2 illustrates a second cross-sectional view along a gate of the first NVM device of FIG. 1.

A cross-sectional view of the NVM device 10 along the gate (word line) 30 is shown in FIG. 2. Isolation regions 15 separate and electrically disconnect (isolate) the second p-region 16 from other second p-regions that may exist on areas of the semiconductor substrate 11 that are not shown. In a preferred embodiment the NVM device is in an isolated well (i.e. the second p-region is an isolated well). However, it is not necessary. The isolation region 15 can be formed using conventional methods to form shallow trench isolation (STI) regions.

The NVM device 10 is programmed using hot carrier injection (HCI) in order to achieve fast program times on the order of microseconds. In one embodiment to achieve HCI programming, the gate 30 is biased at a voltage between approximately 4 to 6 Volts, the drain region 20 is biased at a voltage between approximately 2 to 5 Volts, the source region 18 is biased at a voltage about between 0 to 1 Volt, and the second p-region 16 is biased at a voltage between approximately 0 to −4 Volts. In other words, there is a voltage differential between the second p-region 16, the source region 18, and the drain region 20. When the second p-region 16 is biased to a voltage different than the bias of the source region 18 (i.e. the voltage of the second p-region 16 is biased to a voltage less than that of the source region 18), the voltage applied to the drain region 20 can be lowered. If the second p-region 16 (a portion of the substrate) is biased an improved efficiency and uniformity of programming across the channel region 23 can be achieved. Without biasing the second p-region 16 the injection of the electrons into the charge storage layer 26 occurs primarily near the drain region 20 or more specifically, at the drain halo region 21, so that the majority of the charge is stored near the drain region 20. HCI programming utilizes several voltage supplies (the drain region 20, the gate 30, and the second p-region 16) to heat and redirect the carriers during programming. Thus, no single voltage alone is used to accomplish programming. Thus, the individual voltages can be low, allowing the peripheral circuitry to decrease in size.

To read the NVM device 10 a higher threshold voltage ($V_t$) can be detected by treating the source region 18 as a drain region during read 18 and vice versa. Therefore, the majority of the charge is stored by what is treated as the source region, which was previously the drain region 20, during read. The presence of the stored charge over the source requires a higher gate voltage to read (turn-on) the NVM device 10 due to the fact that the drain depletion region would not be shielding any of the stored charge at the source side of the device during read. In one embodiment, the gate 30 is biased from approximately 1 to 3 Volts, the drain region during read 18 is biased between approximately 0.5 to 1 Volts, the source region during read 20 and the second p-region 16 are grounded (0 Volts).

To erase the NVM device 10 uniform tunnel erase, such as Fowler-Nordheim (FN), modified FN or direct tunneling, is used to pass charge (electron or holes) into or out of the charge storage layer 26. (Typically, modified FN uses lower voltages than FN.) Uniform tunnel erase is desirable since it uses lower current than hot carrier erase (hot hole injection) and removes substantially all the charge from the charge storage layer 26 regardless of the lack of uniformity therein, unlike hot carrier erase which is localized at either the source region 18 or the drain region 20. In a preferred embodiment, the erase voltages are split between the gate 30 and the second p-region 16. In addition, the source region 18 and the drain region 20 are biased to the same voltage as the second p-region 16 to keep the channel region 23 at a common bias. By splitting the voltage, the voltages can be lower than in the case where only the gate 30 is biased. The ability to use low voltages allows for peripheral charge pumps and decoding circuitry to be smaller, thereby decreasing the overall size of an NVM array, which includes the NVM device 10 and related circuitry. In one embodiment, the voltage applied to the gate 30 is between −4 to −7 Volts, and the bias applied to the drain region 20, the source region 18, and the second p-region 16 are between 4 to 7 Volts.

As described above, the NVM device 10 is erased so that the charge leaves the charge storage layer 26 and travels to the channel region 23 via the tunnel dielectric 24. The tunnel dielectric 24 should be thinner than the blocking dielectric 28 so that charge is transferred through the tunnel dielectric 24 and not the blocking dielectric 28. For example, for a tunnel dielectric 24 of about 25 Angstroms, the blocking dielectric 28 is greater than or equal to about 40 Angstroms.

In an alternate embodiment, the charge travels from the charge storage layer 26 to the gate 30. In this embodiment, the functionality of the dielectric layers 28 and 24 are reversed. Hence, for this embodiment, layer 28 will be referred to as the tunnel dielectric 28 and layer 24 as the blocking dielectric 28. The same thicknesses, materials and properties hold for the tunnel dielectric whether it is layer 26 or 28 and the same for the blocking dielectric. For example, the tunnel dielectric 28 should have a thickness between approximately 22 to 32 Angstroms or more specifically, approximately between 26 to 30 Angstroms. In addition, the tunnel dielectric 28 should be a potential barrier that prevents a charge loss of greater than 90% per 10 years. Again, the tunnel dielectric 28 should be thinner than the blocking dielectric 24 in order to allow tunneling of electrons through the tunnel dielectric 28 and preventing electrons from tunneling through the blocking dielectric 24. To erase to the gate 30, the same magnitude of the voltages used for erasing to the channel can be used. However, the sign changes. For example, the gate 30 can be biased to a voltage between 4 and 7 Volts, instead of −4 to −7 Volts. Since the voltage applied to the gate 30 during HCI programming and uniform tunnel erase in this embodiment is positive, a row decoder, which transmits the bias, would only have to accommodate positive voltage or ground. This simplifies the design and results in a smaller size of the NVM device 10 and any peripheral circuitry. In addition, the charge in the charge storage layer 26 will be lost over time from the top of the charge storage layer 26 (i.e. near the interface of the charge storage layer 26 and the tunnel dielectric 28) since the tunnel dielectric 28 is thinner than the blocking layer 26. Thus, the majority of the charge after long periods of time (e.g. 10 years) will be stored closer to the interface between the blocking dielectric 24 and the charge storage layer 26. The closer the charge is to the channel region 23, the greater the effect on the $V_t$ for a given amount of charge in the NVM device. (Electrons make the $V_t$ higher and holes make the $V_t$ lower.) This yields a larger threshold voltage window, meaning the $V_t$ difference between program and erase state is larger than when not erasing to the gate 30.

FIG. 3 illustrates a first array 40 formed on a semiconductor substrate including the NVM device 10 and NVM devices 42, 44 and 46, which can have the same structure as the NVM device 10 discussed in regards to FIGS. 1 and 2. The NVM device 42 and the NVM device 10 are in a first column 51 and have their source regions coupled to each other via a first source line 50 and their drain regions coupled to each other via a first bit line 52. Similarly, the NVM device 44 and the NVM device 46 are in a second column 57 as each other and are electrically isolated from the first column 51. In other words, the isolation regions 15 electrically isolate the first column 51 and the second column 57. A second source line 56 couples each of the NVM devices 44 and 46 source regions to each other and a second bit line 58 couples each of their drain regions to each other. A first word line 47 couples the gates of the NVM devices 10 and 44, which are in the a first row 45, and a second word line 49 couples the gates of the NVM devices 42 and 46, which are in a second row 48. Each column is an isolated well, which can be the second p-region 16 of FIGS. 1 and 2. Thus, the NVM devices 10 and 42 are coupled together in a first well 54, as are the NVM devices 44 and 46 in the second well 60.

In one embodiment, the NVM device 10 is the selected device and the NVM devices 44, 42 and 46 are unselected. Therefore, the first column 51 is a selected column, the second column 57 is an unselected column, the first row 45 is a selected row, and the second row 48 is an unselected row in this embodiment. To program only the NVM device 10, the first word line 47, the first source line 50 and the first bit line 52 are activated to the voltages as discussed above in regards to HCI programming. To prevent programming of unselected NVM devices 42, 44, and 46, the second word line 49, the second bit line 58, the second source line 56, and the second well 60 are deactivated. In one embodiment, they are deactivated by applying a voltage of zero. Alternatively, another voltage can be applied. The voltage that deactivates the word lines, the source lines, the bit lines in the wells depend on the architecture used.

In order to erase the NVM device 10 to the channel regions of the devices during flash EEPROM (electrically erasable programmable read only memory), the NVM devices 10, 42, 44, and 46 are all erased simultaneously (i.e. a bulk erase is performed). Both the first word line 47 and the second word line 49 are biased, for example, at voltages between approximately −4 to −7 Volts, and the first bit line 52, the second bit line 58, the first source line 50, the second source line 56, the first well 54, and the second well 60 are all biased to the same voltages. When performing a channel erase operation (i.e., erasing the charge to the channel region of the NVM devices 10, 42, 44 and 46), voltages between approximately 4 to 7 Volts can be used, and to erase the NVM devices 10, 42, 44 and 46 to the gates of the respective NVM devices 10, 42, 44 and 46, as discussed above, the sign of the voltages is opposite.

A second array 70 formed on a semiconductor substrate that incorporates the NVM device 10 with NVM devices 76, 74 and 78 is shown in FIG. 4. The NVM devices 76, 74 and 78 have the same structure as the NVM device 10. The NVM device 10 and the NVM device 74 are in a first column 85 and have their drain regions coupled to each other via a first bit line 84. Similarly, the NVM device 76 and the NVM device 78 are in a second column 87 and a second bit line 86 couples each of their drain regions to each other. A first word line 80 couples the gates of the NVM devices 10 and 76, which are in a first row 81, and a second word line 82 couples the gates of the NVM devices 74 and 78, which are in a second row 83. The NVM devices 10, 74, 76, and 78 share a common well 88 and a common source region 75. The isolation regions 15, as shown in FIG. 2, although present, do not isolate each NVM device 10, 74, 76 and 78 from each other as in the case in the first array 40, illustrated in FIG. 3. In other words, the second p-region 16 extends below the isolation regions 15 to form a common well 88. However, groups of NVM devices may be isolated from each other, in one embodiment, by a deep isolation region that extends at least as deep as the n-region 14 of FIG. 2. In one embodiment, the deep isolation region is formed by implanting an n-type species.

In one embodiment, the NVM device 10 is the selected device and the NVM devices 74, 76 and 78 are unselected. Therefore, the first column 85 is a selected column, the second column 87 is an unselected column, the first row 81 is a selected row, and the second row 83 is an unselected row in this embodiment. To program only the NVM device 10, the first word line 80, the common well 88, the common source 75, and the first bit line 84 are activated to the HCI programming voltages discussed above. To prevent programming of the unselected NVM devices 74, 76 and 78, the second word line 82, the second bit line 86, are deactivated.

In order to erase the NVM device 10 to the channel regions of the devices during flash EEPROM (electrically erasable programmable read only memory) operation, a bulk erase is performed. To erase to the channel region, both the first word line 80 and the second word line 82 are biased, for example, at voltages between approximately −4 to −7 Volts, and the first and second bit lines 84 and 86, the common source 75, and the common well 88 are all biased to the same voltages, which is this embodiment, is between approximately 4 to 7 Volts. To erase the NVM devices 10, 42, 44 and 46 to the gates of the respective NVM devices 10, 74, 76 and 78, as discussed above, the sign of the voltages is opposite that of the channel erase operation.

FIG. 5 illustrates a third array 90 formed on a semiconductor substrate capable of incorporating the NVM device 10 with NVM devices 92, 94 and 96, which can have the same structure as the NVM device 10 discussed in regards to FIGS. 1 and 2. The NVM device 10 and the NVM device 94 are in a first column 107 and have their source regions coupled to each other via a first source line 106 and their drain regions coupled to each other via a first bit line 108. Similarly, the NVM device 92 and the NVM device 96 are in a second column 111 and a second source line 110 and a second bit line 112 couple each of their source regions and drain regions, respectively, to each other. A first word line 98 couples the gates of the NVM devices 10 and 92, which are in a first row 99 and share a first common well 100. A second word line 102 couples the gates of the NVM devices 94 and 96, which are in a second row 103 and share a second common well 104. The first common well 100 and the second common well 104 are electrically isolated from each other. In other words, the isolation regions 15 in FIG. 2 electrically isolate rows 99 and 103. Each row is an isolated well, which can be the second p-region 16 of FIGS. 1 and 2.

In one embodiment, the NVM device 10 is the selected device and NVM devices 92, 94, 96 are unselected. Therefore, the first column 107 is a selected column, the second column 111 is an unselected column, the first row 99 is a selected row, and the second row 103 is an unselected row in this embodiment. To program only the NVM device 10, the first word line 98, the first source line 106, the first well 100, and the first bit line 108 are activated to the HCI programming voltages discussed above. To prevent programming of the unselected NVM devices 92, 94, and 96, the second word line 102, the second well 104, the second bit line 112, and the second source line 110 are deactivated.

The architecture shown in FIG. 5 allows for the ability to erase single rows (i.e. page erase), since each row is in an isolated well. Both the NVM device 10 and the NVM device 92 (i.e. devices in the first row 99) are erased simultaneously. To perform a channel erase operation, the first word line 98 is activated, for example, at voltages between approximately −4 to −7 Volts and the first source line 106, the second source line 110, the first bit line 108, second bit line 112, and the first well 100 are all biased to the same voltage, which, in one embodiment, is between approximately 4 to 7 Volts. To erase the NVM devices 10 and 92 to the gates of the respective NVM devices 10 and 92, as discussed above, the sign of the voltages is opposite that of the channel erase operation.

To avoid erasing the second row 103 (i.e. the unselected NVM devices 94 and 96), several options can be implemented. For example, the second word line 102 and the second well 104 can be grounded (0 Volts), leading to some source and drain side disturb of the unselected NVM devices 94 and 96. Another option is to bias the second word line 102 and the second well 104 at approximately 4 to 7 Volts, leaving the unselected NVM devices 94 and 96 with a lower net bias on all of the nodes of the device, which may complicate the decoding scheme. Alternatively, pass gates (i.e. transistors) can be placed between the first row 99 and the second row 103 to electrically isolate source and drains of the NVM devices in the first (selected) row 99 from source and drains of the NVM devices the second (unselected) row 103 during erase.

Shown in FIG. 6 is a fourth array 120 is formed on a semiconductor substrate capable of a page erase and that incorporates the NVM device 10 with NVM devices 122, 124 and 126, which can have the same structure as the NVM device 10 discussed in regards to FIG. 1. The NVM device 10 and the NVM device 124 are in a first column 139 and have their drain regions coupled to each other via a first bit line 138. Similarly, the NVM device 122 and the NVM device 126 are in a second column 137 and a second bit line 136 couples each of their drain regions to each other. A first word line 128 couples the gates of the NVM devices 10 and 122, which are in a first row 129 and share a first common well 130. A second word line 132 couples the gates of the NVM devices 124 and 126, which are in a second row 133. The first row 129 and the second row 133 are electrically isolated from each other in one embodiment. The isolation regions 15, as shown in FIG. 2, although present, do not isolate each NVM device 10, 122, 124 and 126 from each other as in the case in the first array 40, illustrated in FIG. 3. In other words, the second p-region 16 of FIG. 2 extends below the isolation regions 15. The first well 130 is electrically isolated from the second well 134 by a deep isolation region that extends at least as deep as the n-region 14 of FIG. 2. In one embodiment, the deep isolation region is formed by implanting an n-type species. Each row is an isolated well, which can be the second p-region 16 of FIGS. 1 and 2. The NVM devices 10, 122, 124, and 126 share a common source 140.

In one embodiment, the NVM device 10 is the selected device and NVM devices 122, 124, and 126 are unselected. Therefore, the first column 139 is a selected column, the second column 137 is an unselected column, the first row 129 is a selected row, and the second row 133 is an unselected row in one embodiment. To program only the NVM device 10, the first word line 128, the source line 140, the first well 130, and the first bit line 138 are activated to HCI programming voltages, as discussed above. To prevent programming of the unselected NVM devices 122, 124, and 126, the second word line 132, the second well 134, and the second bit line 136 are deactivated.

The architecture shown in FIG. 6, like FIG. 5, allows for the ability to erase single rows (i.e. page erase) since each row is in an isolated well. Both the NVM device 10 and the NVM device 122 (i.e. devices in the first row 129) are erased. The first word line 128 is activated, for example, at voltages between approximately −4 to −7 Volts and the source line 140, the first bit line 138, second bit line 136, and the first well 130 are all activated to the same voltage, which, in one embodiment, is between approximately 4 to 7 Volts to erase the NVM devices 10 and 122 to their channel regions. To erase the NVM devices 10 and 122 to the gates of the respective NVM devices 10 and 122, as discussed above, the sign of the voltages is opposite that of erasing the NVM devices 10 and 122 to their channel regions. To avoid erasing the second row 133 (i.e. the unselected NVM devices 124 and 126), several options, which are similar to those discussed in regards to FIG. 5, can be implemented. For example, the second word line 132 and the second well 134 can be deactivated (0 Volts), leading to some source and drain side disturb of the unselected NVM devices 124 and 126. Another option is to bias the second word line 132 and the second well 134 at approximately 4 to 7 Volts, leaving the unselected NVM devices 124 and 126 with a lower net bias on all of the nodes of the device, which may complicate the decoding scheme. Alternatively, pass gates (i.e. transistors) can be placed between the first row 129 and the second row 133 to electrically isolate the sources and drains of the first (selected) row 129 from the sources and drains of the second (unselected) row 133 during erase.

By now it should be appreciated that there has been provided a programming and erase scheme that allows for a fast programming and a low power consumption erase. The programming times are between 1 microsecond to 10 microseconds for programming voltages of 6 Volts or less. This is 1000 times faster than tunnel programming a SONOS device at the same voltage. To obtain fast programming by tunneling, the tunnel dielectric has to be thinned to 22 Angstroms or below, which leads to read disturb problems. Alternatively, the applied voltages could be increased, but the array size would have to increase significantly and tunnel erasing would be complicated due to undesired tunneling through the blocking dielectric. Neither of these disadvantages occur when using the programming and erase scheme described. The uniform tunnel erase as described herein also prevents residual charge build-up in the nitride, which is a problem when HUE is employed, and damage imparted by HHE.

In the foregoing specification, the invention has been described with reference to specific embodiments. However, one of ordinary skill in the art appreciates that various modifications and changes can be made without departing from the scope of the present invention as set forth in the claims below. For example, during page erase the source may also be decoded along with the selected row. Accordingly, the specification and figures are to be regarded in an illustrative rather than a restrictive sense, and all such modifications are intended to be included within the scope of the present invention.

Although the invention has been described with respect to specific conductivity types, skilled artisans appreciate that conductivity types may be reversed.

Moreover, the terms front, back, top, bottom, over, under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The term coupled, as used herein, is defined as connected, although not necessarily directly, and not necessarily mechanically. The term program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/ dynamic load library and/or other sequence of instructions designed for execution on a computer system.

What is claimed is:

1. A method of operating a non-volatile memory cell, wherein the memory cell has a first doped region in a substrate, a second doped region in the substrate, a channel region in the substrate and between the first and second doped regions, a gate over the channel region, and a storage dielectric between the gate and the channel region, comprising:

uniformly erasing the non-volatile memory cell by tunneling from the storage dielectric; and programming the non-volatile memory cell by hot carrier injection to the storage dielectric.

2. The method of claim 1, wherein the memory cell is further characterized as having a tunnel dielectric between the channel region and the storage dielectric.

3. The method of claim 2, wherein the tunnel dielectric provides a potential barrier that prevents a charge loss of greater than ninety percent per ten years.

4. The method of claim 3, wherein the tunnel dielectric is oxide with a thickness between about twenty-two Angstroms and thirty-two Angstroms.

5. The method of claim 4, wherein the tunnel dielectric is between about twenty-six and thirty Angstroms.

6. The method of claim 5, further comprising a blocking dielectric between the gate region and the storage dielectric.

7. The method of claim 1, wherein the memory cell is further characterized as having a tunnel dielectric between the gate and the storage dielectric.

8. The method of claim 7, wherein the tunnel dielectric provides a potential barrier that prevents a charge of less than ninety percent per ten years.

9. The method of claim 8, wherein the tunnel dielectric is oxide with a thickness between about twenty-two Angstroms and thirty Angstroms.

10. The method of claim 9, wherein the thickness of the tunnel dielectric between about twenty-six and twenty-nine Angstroms.

11. The method of claim 10, further comprising a blocking dielectric between the channel region and the storage dielectric.

12. The method of claim 11, wherein the blocking dielectric is thicker than the tunnel dielectric.

13. A memory cell, comprising:

a first doped region in a substrate;

a second doped region in the substrate;

a channel region between the first and second doped regions;

a gate overlying the channel region;

a storage dielectric between the gate and the channel region; and a tunnel dielectric, between the storage dielectric and one of the channel region and the gate, for passing charge during a uniform erase operation from the storage dielectric by tunneling, passing charge to the storage dielectric during a program operation by hot carrier injection, and providing a potential barrier that prevents a charge loss of greater than ninety percent per ten years.

14. The memory cell of claim 13, further comprising:

a well region in the substrate for containing the channel, first doped, and second doped regions; and bias means for biasing the well region to establish a voltage difference between the well region, and the first doped region dining the program operation.

15. A non-volatile memory device, comprising:

an array of memory cells having a first column, a second column, a first row, and a second row on a semiconductor substrate, each memory cell in the array comprising:

a first doped region in a substrate;

a second doped region in the substrate;

a channel region between the first and second doped regions;

a gate overlying the channel region;

a storage dielectric between the gate and the channel region; and a tunnel dielectric, between the storage dielectric and one of the channel region and the gate, for removing charge during a uniform erase operation from the storage dielectric by tunneling, providing charge during a program operation to the storage dielectric by hot carrier injection, and providing a potential barrier that prevents a charge loss of greater than ninety percent per ten years.

16. The non-volatile memory device of claim 15, wherein a first memory cell of the array of memory cells is in the first row and first column, a second memory cell of the array of memory cells is in the first row and second column, a third memory cell of the array of memory cells is in the second row and the first column, and a fourth memory cell of the array of memory cells is in the second row and the second column, wherein:

the second doped regions of the first and third memory cells are coupled to a first bit lined;

the first doped regions of the first and third memory cells are coupled to a first source line;

the gates of the first and second memory cells are coupled to a first word line;

the second doped regions of the second and fourth memory cells are coupled to a second bit line;

the first doped regions of the second and fourth memory cells are coupled to a second source line; and the gates of the third and fourth memory cells are coupled to the second ward line.

17. The non-volatile memory device of claim 16, wherein the first and third memory cells are in a first well region and the second and fourth memory cells are in a second well region.

18. The non-volatile memory device of claim 17, wherein the first row is erased by:

activating the first word line while deactivating the second word line; and activating the first and second source lines, the first and second bit lines, and the first and second well regions.

19. The non-volatile memory device of claim 18, wherein the first and second rows are erased by:

activating the first and second word lines; and activating the first and second source lines, the first and second bit lines, and the first and second well regions.

20. The non-volatile memory device of claim wherein the first memory cell is programmed by:

activating the first word line while deactivating the second word line; and activating the first source line while deactivating the second source line, activating the first bit line while deactivating the second bit line, activating the first well region while deactivating the second well region.

21. The non-volatile memory device of claim 20, wherein the step of activating the first well region comprises applying a bias voltage between the first doped region of the first memory cell and the first well region.

22. The non-volatile memory device of claim 16, wherein the first and second memory cells are in a first well region and the third and fourth memory cells are in a second well region.

23. The non-volatile memory device of claim 22, wherein the first row is erased by:

activating the first word line while deactivating the second word line; and activating the first and second source lines, the first and second bit lines, and the first well region while deactivating the second well region.

24. The non-volatile memory device of claim 23, wherein the first and second rows are erased by:

activating the first and second word lines; and activating the first and second source lines, the first and second bit lines, and the first and second well regions.

25. The non-volatile memory device of claim 22, wherein the first memory cell is programmed by;

activating the first word line while deactivating the second word line; and activating the first source line, while deactivating the second source line, activating the first bit line while deactivating the second bit line, activating the first well region while deactivating the second well region.

26. The non-volatile memory device of claim 25, wherein the step of activating the first well region comprises applying a bias voltage between the first doped region of the first memory cell and the first well region.

27. The non-volatile memory device of claim 15, wherein a first memory cell of the array of memory cells is in the first row and first column, a second memory cell of the array of memory cells is in the first row and second column, a third memory cell of the array of memory cells is in the second row and the first column, and a fourth memory cell of the array of memory cells is in the second row and the second column, wherein:

the second doped regions of the first and third memory cells are coupled to a first bit line;

the first doped regions of the first, second, third, and fourth memory cells are coupled to a first source line;

the gates of the first and second memory cells are coupled to a first word line;

the second doped regions of the second and fourth memory cells are coupled to a second bit line; and the gates of the third and fourth memory cells are coupled to the second word line.

28. The non-volatile memory device of claim 27, wherein the first, second, third, and fourth memory cells are in a first well region.

29. The non-volatile memory device of claim 28, wherein the first row is erased by:
   activating the first word line while deactivating the second word line; and
   activating the first source line, the first and second bit lines, and the first well region.

30. The non-volatile memory device of claim 29, wherein the first and second rows are erased by:
   activating the first and second word lines; and
   activating the first source line, the first and second bit lines, and the first well region.

31. The non-volatile memory device of claim 28, wherein the first memory cell is programmed by:
   activating the first word line while deactivating the second word line; and
   activating the first source line, activating the first bit line while deactivating the second bit line, activating the first well region.

32. The non-volatile memory device of claim 31, wherein the step of activating the first well region comprises applying a bias voltage between the first doped region of the first memory cell and the first well region.

33. The non-volatile memory device of claim 27, wherein the first and second memory cells are in a first well region and the third and fourth memory cells are in a second well region.

34. The non-volatile memory device of claim 33, wherein the first row is erased by:
   activating the first word line while deactivating the second word line;
   activating the first source line and the first and second bit lines; and
   activating the first well region while deactivating the second well region.

35. The non-volatile memory device of claim 34, wherein the first and second rows are erased by:
   activating the first and second word lines; and
   activating the first source line, the first and second bit lines, and the first and second well regions.

36. The non-volatile memory device of claim 33, wherein the first memory cell is programmed by:
   activating the first word line while deactivating the second word line;
   activating the first source line;
   activating the first bit line while deactivating the second bit line; and
   activating the first well region while deactivating the second well region.

37. The non-volatile memory device of claim 36, wherein the step of activating the first well region comprises applying a bias voltage between the first doped region of the first memory cell and the first well region.

38. A method of operating a non-volatile memory device, wherein the memory cell has a first doped region formed in a substrate, a second doped region in the substrate, a channel region in the substrate and between the first and second doped regions, a gate over the channel region, and a storage dielectric between the gate and the channel region, comprising:
   uniformly erasing the non-volatile memory cell by tunneling from the storage dielectric;
   programming the non-volatile memory cell by flowing current from the first doped region to the second doped region to cause hot carrier injection into the storage dielectric; and
   reading the non-volatile memory cell programmed by the step of programming by flowing current from one of a first current electrode to a second current electrode and the second current electrode to the first current electrode.

* * * * *

UNITED STATES PATENT AND TRADEMARK OFFICE
CERTIFICATE OF CORRECTION

PATENT NO. : 6,791,883 B2
APPLICATION NO. : 10/178658
DATED : June 24, 2002
INVENTOR(S) : Craig T. Swift It is certified that error appears in the above-identified patent and that said Letters Patent is hereby corrected as shown below:

In Column 10, Line 44, Claim No. 6:
    Change "gate region" to --channel region--

In Column 11, Line 16, Claim No. 14:
    Change "the well region," to --the well region--

In Column 11, Line 17, Claim No. 14:
    Change "doped region dining" to --doped region during--

In Column 11, Line 47, Claim No. 16:
    Change "bit lined;" to --bit line;--

In Column 11, Line 57, Claim No. 16:
    Change "second ward" to --second word--

In Column 12, Line 8, Claim No. 20:
    Change "of claim wherein" to --of claim 17, wherein--

In Column 14, Line 33, Claim No. 38:
    Change "one of a" to --one of the--

In Column 14, line 34, Claim No. 38:
    Change "first current electrode to a second" to --first current electrode to the second--

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,791,883 B2
APPLICATION NO. : 10/178658
DATED : September 14, 2004
INVENTOR(S) : Craig T. Swift It is certified that error appears in the above-identified patent and that said Letters Patent is hereby corrected as shown below:

In Column 10, Line 44, Claim No. 6:
    Change "gate region" to --channel region--

In Column 11, Line 16, Claim No. 14:
    Change "the well region," to --the well region--

In Column 11, Line 17, Claim No. 14:
    Change "doped region dining" to --doped region during--

In Column 11, Line 47, Claim No. 16:
    Change "bit lined;" to --bit line;--

In Column 11, Line 57, Claim No. 16:
    Change "second ward" to --second word--

In Column 12, Line 8, Claim No. 20:
    Change "of claim wherein" to --of claim 17, wherein--

In Column 14, Line 33, Claim No. 38:
    Change "one of a" to --one of the--

UNITED STATES PATENT AND TRADEMARK OFFICE
CERTIFICATE OF CORRECTION

PATENT NO. : 6,791,883 B2
APPLICATION NO. : 10/178658
DATED : September 14, 2004
INVENTOR(S) : Craig T. Swift It is certified that error appears in the above-identified patent and that said Letters Patent is hereby corrected as shown below:

In Column 14, line 34, Claim No. 38:
Change "first current electrode to a second" to --first current electrode to the second--

This certificate supersedes the Certificate of Correction issued May 20, 2008.

Signed and Sealed this

Seventeenth Day of June, 2008

JON W. DUDAS
*Director of the United States Patent and Trademark Office*